US012558728B2

(12) United States Patent
Von Fieandt et al.

(10) Patent No.: US 12,558,728 B2
(45) Date of Patent: *Feb. 24, 2026

(54) CUTTING TOOL

(71) Applicant: AB SANDVIK COROMANT, Sandviken (SE)

(72) Inventors: Linus Von Fieandt, Sandviken (SE); Erik Lindahl, Sandviken (SE); Katalin Boor, Sandviken (SE)

(73) Assignee: AB Sandvik Coromant, Sandviken (SE)

( * ) Notice: Subject to any disclaimer, the term of this patent is extended or adjusted under 35 U.S.C. 154(b) by 145 days.

This patent is subject to a terminal disclaimer.

(21) Appl. No.: 18/559,073

(22) PCT Filed: May 6, 2022

(86) PCT No.: PCT/EP2022/062300
§ 371 (c)(1),
(2) Date: Nov. 6, 2023

(87) PCT Pub. No.: WO2022/234095
PCT Pub. Date: Nov. 10, 2022

(65) Prior Publication Data
US 2024/0227028 A1 Jul. 11, 2024

(30) Foreign Application Priority Data
May 7, 2021 (EP) .................................... 21172624

(51) Int. Cl.
B23B 27/14 (2006.01)
C23C 16/02 (2006.01)
(Continued)

(52) U.S. Cl.
CPC ........ B23B 27/148 (2013.01); C23C 16/0272 (2013.01); C23C 16/308 (2013.01);
(Continued)

(58) Field of Classification Search
None
See application file for complete search history.

(56) References Cited

U.S. PATENT DOCUMENTS

2003/0126945 A1* 7/2003 Liu ......................... C23C 16/36
419/57

FOREIGN PATENT DOCUMENTS

JP        2009125902 A  *  6/2009
WO        2020239747 A1    12/2020

OTHER PUBLICATIONS

Hulkko et al. "CVD system and control program for WF6 chemistry", Licentiate thesis, Monograph, Uppsala University, 2019, Licentiate thesis, Monograph, Uppsala University, 2019.
(Continued)

*Primary Examiner* — Seth Dumbris
(74) *Attorney, Agent, or Firm* — Corinne R. Gorski

(57) ABSTRACT

A coated cutting tool includes a substrate at least partially coated with a coating. The substrate is made of cemented carbide composed of hard constituents in a metallic. The metallic binder includes more than 60 wt % Ni. The coating has two or more layers, wherein the layer adjacent to the substrate is a $W(C_xN_{1-x})_y$ layer, wherein $0.6 \leq x \leq 0.8$ and $1.1 \leq y \leq 1.8$ with a $W(C_xN_{1-x})_y$ layer thickness of 0.4-7 μm.

15 Claims, 3 Drawing Sheets

(51) Int. Cl.

| | |
|---|---|
| *C23C 16/30* | (2006.01) |
| *C23C 16/34* | (2006.01) |
| *C23C 16/36* | (2006.01) |
| *C23C 16/40* | (2006.01) |

(52) U.S. Cl.
CPC .............. *C23C 16/34* (2013.01); *C23C 16/36* (2013.01); *C23C 16/403* (2013.01); *B23B 2228/105* (2013.01)

(56) References Cited

OTHER PUBLICATIONS

Gogova et al. "CVD-WC and WC"xN'y diffusion barrier coatings on WE/Co metalloceramics", Materials Letters, Elsevier, Amsterdam, NL. vol. 35, Jun. 1, 1998, pp. 351-356.

\* cited by examiner

2μm

2μm

CUTTING TOOL

Related Application Data

This application is a § 371 National Stage Application of PCT International Application No. PCT/EP2022/062300 filed May 6, 2022 with priority to EP 21172624.5 filed May 7, 2021.

TECHNICAL FIELD

The present invention relates to a coated cutting tool. The cutting tool is CVD coated and the substrate is a cemented carbide wherein the metallic binder in the cemented carbide comprises Ni. The CVD coating comprises an inner layer of $W(C_xN_{1-x})_y$.

BACKGROUND

CVD coated cutting tools are well known in the area of cutting tools for chip forming metal cutting operations. The substrate of the coated cutting tool is usually of cemented carbide wherein the cemented carbide is made of WC in a metallic binder of Co. Alternative binders without Co or with reduced amount of Co are being developed but are still rare or non-existing in the products on the market. It is not only the production of the cemented carbide itself, it is also the coating of the cemented carbide that is demanding since interactions occur between the gas phase and the cemented carbide, especially during chemical vapor deposition which is performed using reactive gases at high temperature.

Among the alternative metallic binders a mixture of Ni and Fe is a promising candidate. Ni shows a high reactivity with for example Ti and a high amount of Ni in the cemented carbide causes problems in chemical vapor deposition of a Ti-containing coating since intermetallic phases such as $Ni_3Ti$ form at the interface between the cemented carbide and the coating and also within the coating. Intermetallic phases such as $Ni_3Ti$ at the interface or in the lower part of the Ti-containing coating reduce the coating adhesion and negatively influence the wear resistance of a coating subsequently deposited on the Ti-containing coating.

The problem of the formation of $Ni_3Ti$ during deposition of a TiN coating on Ni metal substrates is analyzed in "Chemical vapor deposition of TiN on transition metal substrates" by L. von Fieandt et al, Surface and Coatings Technology 334 (2018) 373-383. It was concluded that the formation of $Ni_3Ti$ could be reduced by an excess of $N_2$ partial pressure and low $H_2$ partial pressure during the CVD process.

It is an object of the present invention to provide a cutting tool with Ni containing cemented carbide substrate with a wear resistant CVD coating. It is also an object to provide a method of depositing a coating comprising a layer of 001 oriented $\alpha$-$Al_2O_3$ on a Ni-containing cemented carbide substrate, especially a substrate containing a metallic binder with more than 60 wt % Ni.

DESCRIPTION OF THE INVENTION

The present invention relates to a coated cutting tool comprising a substrate at least partially coated with a coating, said substrate is made of cemented carbide composed of hard constituents in a metallic binder and wherein said metallic binder comprises more than 60 wt % Ni, said coating comprise two or more layers, wherein the layer adjacent to the substrate is a $W(C_xN_{1-x})_y$ layer, wherein $0.6 \leq x \leq 0.8$ and $1.1 \leq y \leq 1.8$, preferably $0.67 \leq x \leq 0.72$ and $1.17 \leq y \leq 1.76$, with a $W(C_xN_{1-x})_y$ layer thickness of 0.4-7 µm.

Cemented carbide materials are useful in high demanding cutting tool applications due to their high hardness and high wear resistance in combination with a high toughness. Cemented carbide materials are produced by powder metallurgical methods, wherein the starting powders are mixed, milled, formed into a green body, pre-sintered and sintered.

Cemented carbide materials generally consist of hard constituents of WC and optional carbides and/or nitrides such as TiC in a metallic binder of for example Co or Co in combination with Ni and Fe. In the present invention the metallic binder comprises more than 60 wt % Ni. High content of Ni in the metallic binder have shown to be especially demanding in CVD deposition. The cemented carbide composition, and especially the metallic binder composition, can be analyzed by chemical analysis.

It was surprisingly found that a $W(C_xN_{1-x})_y$ layer with said composition and a thickness of 0.4 µm or more could prevent the Ni in the metallic binder to have a negative impact on the subsequently deposited layers. The $W(C_xN_{1-x})_y$ layer thereby had the function of a diffusion barrier layer, preventing the substrate to influence the coating quality. The $W(C_xN_{1-x})_y$ layer can thus, with a layer thickness of larger than 0.4 µm, prevent the formation of reaction products between Ti and Ni.

The high amount of C and N in the $W(C_xN_{1-x})_y$ layer of the present invention, with $1.1 \leq y \leq 1.8$, preferably $1.17 \leq y \leq 1.76$, is believed to contribute to a stable layer also when the coating is exposed to metal cutting applications which usually implies high pressure and high temperature.

In one embodiment of the present invention the $W(C_xN_{1-x})_y$ layer is of hexagonal phase. This is advantageous since the thermal expansion coefficient of hexagonal W(C,N) is similar to the one of WC. This might prevent the formation of thermal cracks during production of the coated cutting tool and it might also have an influence on the tool life since cutting tools are usually exposed to thermal cycles during usage in cutting such as in intermittent cutting. By hexagonal phase is herein meant $\delta$-WC hexagonal phase.

In one embodiment of the present invention the $W(C_xN_{1-x})_y$ layer is composed of grains that are columnar. By columnar is herein meant an aspect ratio of grain length to grain width of higher than one.

In one embodiment of the present invention the average grain width of the $W(C_xN_{1-x})_y$ layer is 0.14-0.40 µm, preferably 0.15-0.30 µm.

In one embodiment of the present invention the $W(C_xN_{1-x})_y$ layer exhibits an orientation as measured with EBSD on a cross section of said $W(C_xN_{1-x})_y$ layer and an analyzed area of 100 µm in width and the full $W(C_xN_{1-x})_y$ layer thickness in height, wherein a surface normal of the $W(C_xN_{1-x})_y$ layer is parallel to the growth direction of said layer, wherein $\geq 75\%$ of the analyzed area has a <11-20> direction within 30 degrees from the surface normal of the $W(C_xN_{1-x})_y$ layer, preferably $\geq 80\%$ of the analyzed area is within 30 degrees from the <11-20> direction.

In one embodiment of the present invention the metallic binder comprises 65-90 wt % Ni, preferably 70-87 wt % Ni, more preferably 75-85 wt % Ni.

In one embodiment of the present invention the metallic binder comprises 10-20 wt % Fe, preferably 10-15 wt % Fe.

In one embodiment of the present invention the metallic binder comprises 3-8 wt % Co, preferably 5-6 wt % Co.

In one embodiment of the present invention the metallic binder comprises 65-90 wt % Ni, 10-20 wt % Fe and 3-8 wt % Co. In one embodiment the metallic binder is an Ni—Fe—Co alloy.

In one embodiment of the present invention the metallic binder content in the cemented carbide is 3-20 wt %, preferably 5-15 wt %, most preferably 5-10 wt %.

In one embodiment of the present invention the coating comprises a TiN layer and the thickness of the TiN layer is 0.3-1 μm.

In one embodiment of the present invention the coating comprises a TiCN layer and preferably the thickness of the TiCN layer is 6-12 μm.

In one embodiment of the present invention the TiCN layer exhibits a texture coefficient TC(hkl), as measured by X-ray diffraction using Cu Kα radiation and θ-2θ scan, defined according to Harris formula $$TC(hkl) = \frac{I(hkl)}{I_0(hkl)}\left[\frac{1}{n}\sum_{n=1}^{n}\frac{I(hkl)}{I_0(hkl)}\right]^{-1}$$

where I(hkl) is the measured intensity (integrated area) of the (hkl) reflection, $I_0(hkl)$ is the standard intensity according to ICDD's PDF-card No 42-1489, n is the number of reflections, reflections used in the calculation are (1 1 1), (2 0 0), (2 2 0), (3 1 1), (3 3 1), (4 2 0), (4 2 2) and (5 1 1), wherein TC(4 22) is ≥3.5.

In one embodiment of the present invention the total thickness of the coating is 2-25 μm.

In one embodiment of the present invention the coating further comprises a layer of $Al_2O_3$, preferably located between the outermost surface of the cutting tool and a $W(C_xN_{1-x})_y$ layer.

In one embodiment of the present invention the $Al_2O_3$ layer is an α-$Al_2O_3$ layer.

In one embodiment of the present invention the α-$Al_2O_3$ layer exhibits a texture coefficient TC(hkl), as measured by X-ray diffraction using Cu Kα radiation and θ-2θ scan, defined according to Harris formula where I(hkl) is the measured intensity (integrated area) of the (hkl) reflection, $I_0(hkl)$ is the standard intensity according to ICDD's PDF-card No. 00-010-0173, n is the number of reflections used in the calculation, and where the (hkl) reflections used are (1 0 4), (1 1 0), (1 1 3), (024), (1 1 6), (2 1 4), (3 0 0) and (0 0 12) characterized in that TC(0 0 12)≥7, preferably ≥7.2.

In one embodiment of the present invention the thickness of the $Al_2O_3$ layer is 4-8 μm.

In one embodiment of the present invention the cutting tool is a drill, a milling insert or a turning insert, preferably a turning insert.

In one embodiment the $W(C_xN_{1-x})_y$ layer is a CVD layer. In one embodiment the TiCN layer is a CVD layer. In one embodiment the $Al_2O_3$ layer is a CVD layer. In one embodiment of the present invention the coating is a CVD coating.

Still other objects and features of the present invention will become apparent from the following definitions and examples considered in conjunction with the accompanying drawings.

Methods

Composition of $W(C_xN_{1-x})_y$ Layer

The elemental compositions of the $W(C_xN_{1-x})_y$ layers were analyzed by ToF-ERDA (time-of-flight elastic recoil detection analysis) utilizing a 36 MeV $^{127}I^{8+}$ beam with an incident angle of 67.5° with respect to the surface normal and a recoil detection angle of 45°. The gas ionization chamber detector detects the number and energy of both the scattered $^{127}I^{8+}$ ions, but more importantly also the recoil atoms from the sample. This analysis was combined with a time-of-flight analyzer, which together with the energy detection enabled the calculation of the atomic masses. Thereby the elemental depth profile of the coating was obtained.

The data analysis was carried out using the Potku software. The concentrations were calculated by integrating the depth profile between $250\times10^{15}$ and $2000\times10^{15}$ atoms/cm2 from the sample surface, approximately between 30-200 nm.

Phase Analysis of $W(C_xN_{1-x})_y$ Layer

To analyze the phase composition of the grains in the $W(C_xN_{1-x})_y$ layer grazing incidence X-ray diffraction (GI-XRD) measurements were made. An incident angle of 1° was used. The GI-XRD measurements were carried out using a Philips MRD X'Pert diffractometer with a Cu Kα-source and a Göbel-mirror providing a parallel incident beam. A mirror slit allowing for a 1.4 mm beam was used and a 0.04 rad soller slit was placed on the primary beam side. The secondary beam was collimated with a 0.27° collimator and the intensity was recorded with a proportional detector. The sample heights and 0-tilts were aligned by applying a z-, ω-, and a fine z-scan using a direct beam. The beam intensity during the alignment was reduced by a Cu/Ni manual beam attenuator, the mirror slit was also reduced to give a beam size of 0.09 mm. A parallel plate collimator receiving slit was inserted to select a single channel of the secondary beam collimator for the alignment.

Grain Width and Orientation of $W(C_xN_{1-x})_y$ Layer

The grain width and the orientation or texture of the $W(C_xN_{1-x})_y$ layer were analyzed using Electron Backscatter Diffraction (EBSD) analysis.

The preparation of the polished cross-sections was performed by mounting each of the CNMG120408-PM inserts in a black conductive phenolic resin from AKASEL which were afterwards ground down about 1 mm and then polished in two steps: rough polishing (9 μm) and fine polishing (1 μm) using a diamond slurry solution. A final polish using colloidal silica solution was applied. All the samples were mounted in a pre-tilted holder with a 70° angle to ensure maximum data collection efficiency. During the data analysis the coordinate system was aligned to correct for misalignments in the microscope.

For all the EBSD measurements the grains from the WC-Co substrates were removed from the data to ensure that all the collected data originated from the $W(C_xN_{1-x})_y$ coating. Regions of at least 100 μm width and the full layer thickness in height were analyzed with a step size of 50 nm, Speed 1 binning mode (622×512 pix) was used for all the EBSD investigations. In the grain width measurement at least 700 grains were used for each grain width determination.

The orientation of the $W(C_xN_{1-x})_y$ layer was determined as the amount in (%) of $W(C_xN_{1-x})_y$ in an analyzed sample that is within a certain angular deviation from a set axis. <11-20> $W(C_xN_{1-x})_y$ direction was chosen as the direction parallel to the surface normal. The orientation of the $W(C_xN_{1-x})_y$ layer was calculated as the amount of analyzed area that was ≤30° deviation from the <11-20> $W(C_xN_{1-x})_y$ direction. One auto-clean up step was used to gently reduce the noise level of the data. The orientation of the $W(C_xN_{1-x})_y$ layers were then defined from the EBSD results on a cross section of said $W(C_xN_{1-x})_y$ layer and an analyzed area of 100 μm in width and the full $W(C_xN_{1-x})_y$ layer thickness in height, wherein a surface normal of the $W(C_xN_{1-x})_y$ layer is parallel to the growth direction of said layer, wherein ≥75% of the analyzed area has a <11-20> direction within 30 degrees from the surface normal of the $W(C_xN_{1-x})_y$ layer, preferably ≥80% of the analyzed area has a <11-20> direction within 30 degrees from the surface normal of the $W(C_xN_{1-x})_y$ layer.

The average grain width of the $W(C_xN_{1-x})_y$ was analyzed by using EBSD of the same measurement area as mentioned in the previous section. The grain width measurement was done using the Aztec Crystal v. 2.0 software package, using the fitted ellipse minor diameter grain sizing. Where an ellipse is fitted to each grain and the minor diameter of each ellipse is determined as the grain width. One auto-clean up step was used to gently reduce the noise level of the data and all grains with an area <5 pixels were discarded to ensure that measurement noise was not included and thus increase the accuracy of the measurement. The grain threshold was set to 10°.

The WC, Acta Crystallogr, [ACCRA9], 1961, vol 14 pp 200-201, reference pattern was used for $W(C_xN_{1-x})_y$ for the EBSD measurements, 53 reflectors were used for the measurements.

A Zeiss Supra 55VP equipped with an Oxford Symmetry EBSD detector was used for all the EBSD measurements. The accelerating voltage was set at 20 kV and a probe current between 10-30 nA was used.

SEM Investigation

The SEM investigation was carried out in a Zeiss Supra 55VP microscope. The acceleration voltage was 3 kV and the probe current was 300 pA.

Orientation of TiCN and α-Al$_2$O$_3$ Layers

In order to investigate the orientation of the TiCN and alumina layers X-ray diffraction was conducted on the flank face of cutting tool inserts using a PANalytical CubiX3 diffractometer equipped with a PIXcel detector. The coated cutting tool inserts were mounted in sample holders to ensure that the flank face of the cutting tool inserts is parallel to the reference surface of the sample holder and also that the flank face was at appropriate height. Cu Kα radiation was used for the measurements, with a voltage of 45 kV and a current of 40 mA. Anti-scatter slit of ½ degree and divergence slit of ¼ degree were used. The diffracted intensity from the coated cutting tool was measured in the range 20° to 140° 2θ, i.e. over an incident angle θθ range from 10 to 70°.

The data analysis, including background subtraction, Cu Kα$_2$ stripping and profile fitting of the data, was done using PANalytical's X'Pert HighScore Plus software. A general description of the fitting is made in the following. The output (integrated peak areas for the profile fitted curve) from this program was then used to calculate the texture coefficients of the layer by comparing the ratio of the measured intensity data to the standard intensity data according to a PDF-card of the specific layer (such as a layer of TiCN or α-Al$_2$O$_3$), using the Harris formula (1) as disclosed above. Since the layer is finitely thick the relative intensities of a pair of peaks at different 2θ angles are different than they are for bulk samples, due to the differences in path length through the layer. Therefore, thin film correction was applied to the extracted integrated peak area intensities for the profile fitted curve, taken into account also the linear absorption coefficient of layer, when calculating the TC values. Since possible further layers above for example the α-Al$_2$O$_3$ layer will affect the X-ray intensities entering the α-Al$_2$O$_3$ layer and exiting the whole coating, corrections need to be made for these as well, taken into account the linear absorption coefficient for the respective compound in a layer. The same applies for X-ray diffraction measurements of a TiCN layer if the TiCN layer is located below for example an α-Al$_2$O$_3$ layer. Alternatively, a further layer, such as TiN, above an alumina layer can be removed by a method that does not substantially influence the XRD measurement results, e.g. chemical etching.

The texture coefficients TC(hkl) for different growth directions of the columnar grains of the TiCN layer were calculated according to Harris formula, $$TC(hkl) = \frac{I(hkl)}{I_0(hkl)}\left[\frac{1}{n}\sum_{n=1}^{n}\frac{I(hkl)}{I_0(hkl)}\right]^{-1}$$

where I(hkl) is the measured (integrated area) intensity of the (hkl) reflection, $I_0$(hkl) is the standard intensity according to ICDD's PDF-card no 42-1489, n is the number of reflections to be used in the calculation. In this case the (hkl) reflections used are (1 1 1), (2 0 0), (2 2 0), (3 1 1), (3 3 1), (4 2 0), (4 2 2) and (5 1 1).

In order to investigate the texture of the α-Al$_2$O$_3$ layer X-ray diffraction was conducted using Cu Kα radiation and texture coefficients TC(hkl) for different growth directions of the columnar grains of the α-Al$_2$O$_3$ layer were calculated according to Harris formula, where I(hkl)=measured (integrated area) intensity of the (hkl) reflection, $I_0$(hkl)=standard intensity according to ICDD's PDF-card no 00-010-0173, n=number of reflections to be used in the calculation. In this case the (hkl) reflections used are: (1 0 4), (1 1 0), (1 1 3), (0 2 4), (1 1 6), (2 1 4), (3 0 0) and (0 0 12). The measured integrated peak area is thin film corrected and corrected for any further layers above (i.e. on top of) the α-Al$_2$O$_3$ layer before said texture coefficient is calculated.

It is to be noted that peak overlap is a phenomenon that can occur in X-ray diffraction analysis of coatings comprising for example several crystalline layers and/or that are deposited on a substrate comprising crystalline phases, and this has to be considered and compensated for. An overlap of peaks from the α-Al$_2$O$_3$ layer with peaks from the TiCN layer might influence measurement and needs to be considered. It is also to be noted that also for example WC in the substrate and $W(C_xN_{1-x})_y$ in the coating can have diffraction peaks that might influence the measurement and need to be considered.

BRIEF DESCRIPTION OF DRAWINGS

Embodiments of the invention will be described with reference to the accompanying drawings, wherein.

EXAMPLES

Figure 1:
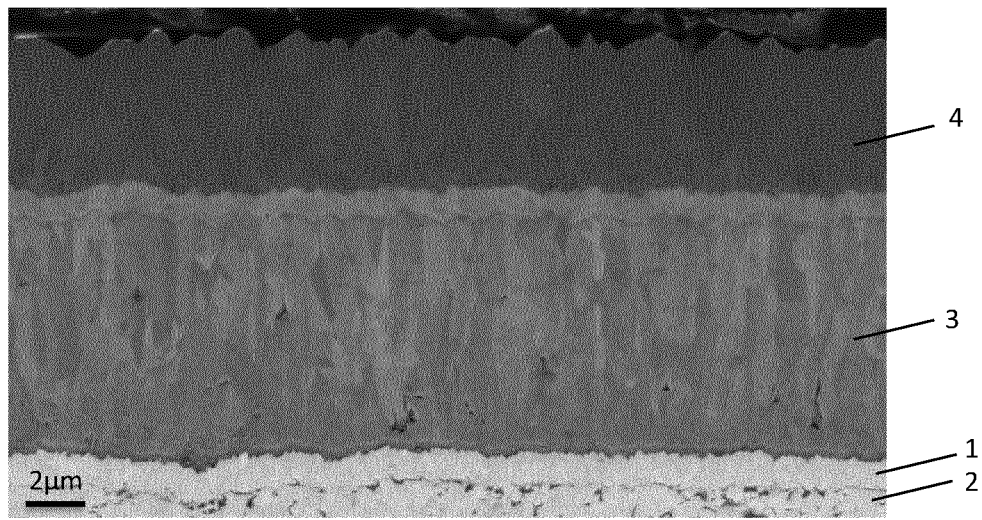
FIG. 1 is a cross-sectional SEM micrograph showing the $W(C_xN_{1-x})_y$ layer of a coated cutting tool according to one embodiment of the invention (Sample E1), wherein the $W(C_xN_{1-x})_y$ layer (1), the substrate (2), the TiCN layer (3) and the α-Al$_2$O$_3$ layer are indicated.
Figure 2:
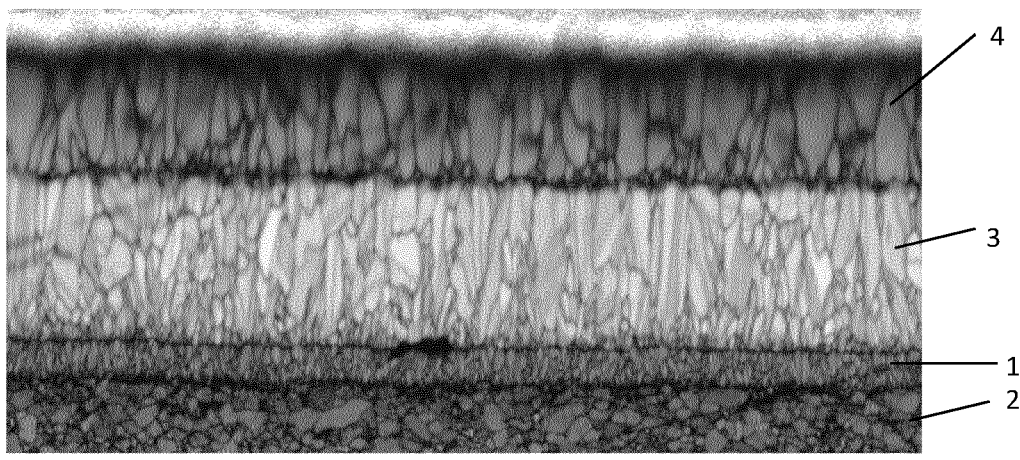
FIG. 2 is an EBSD-band contrast micrograph of the coated cutting tool shown in FIG. 1, wherein the $W(C_xN_{1-x})_y$ layer (1), the substrate (2), the TiCN layer (3) and the $\alpha$-$Al_2O_3$ layer are indicated.
Figure 3:
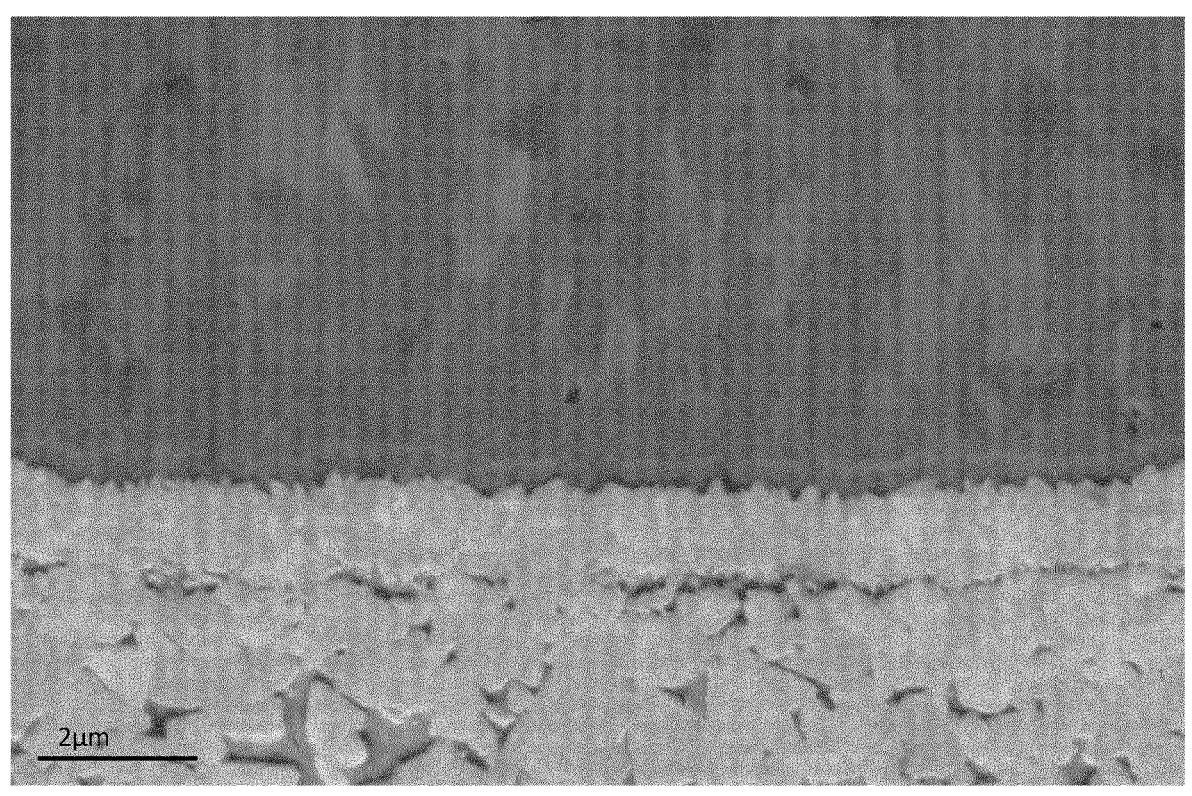
FIG. 3 is a close-up of the $W(C_xN_{1-x})_y$ layer of the coated cutting tool shown in FIG. 1.
Figure 4:
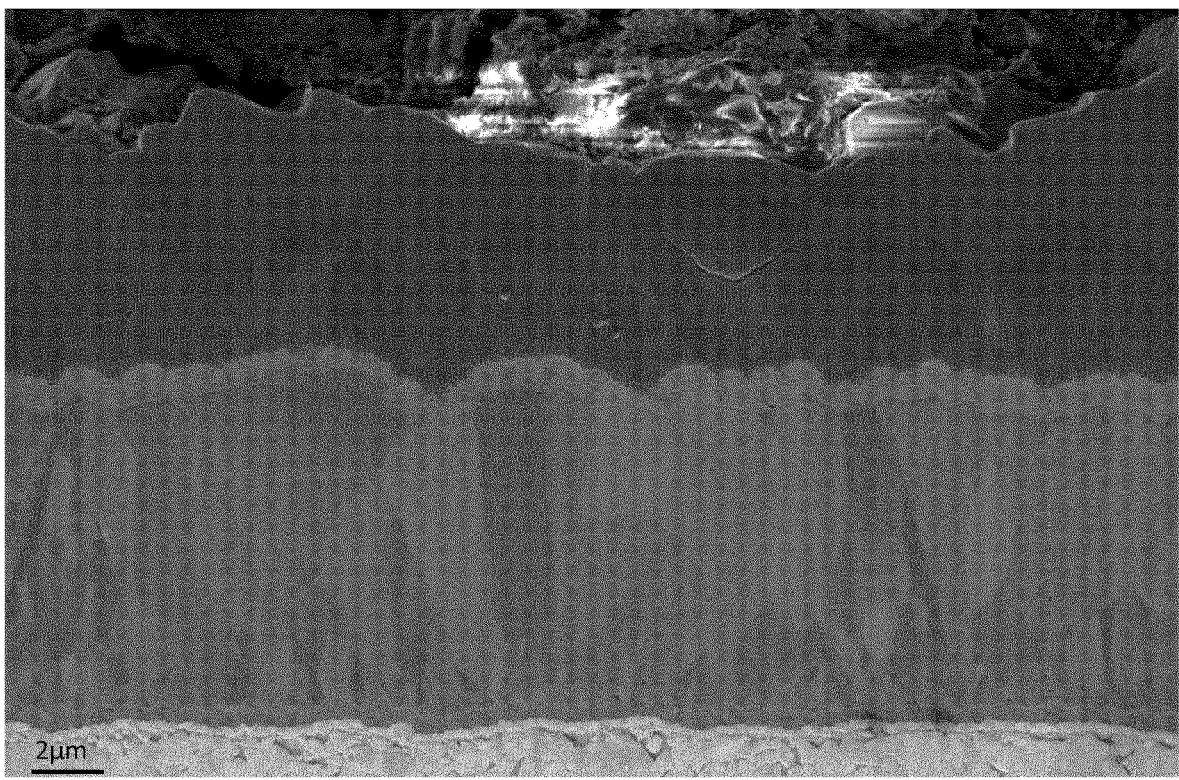
FIG. 4 is a cross-sectional SEM micrograph showing the too thin $W(C_xN_{1-x})_y$ layer of a coated cutting tool according to a reference (Sample C), and FIG. 5 Grazing incidence X-ray diffractogram of sample E1. The dashed lines show the peak positions of a $\delta$-WC reference (from Z. Anorg. Allg. Chem., 1926 vol 156 pp 27-36) and the numbers indicate the crystallographic planes to which the peaks belong. The intensity scale is logarithmic in order to enhance the peaks with lower intensity. The diffractogram shows that only the hexagonal $\delta$-WC phase is present in the coating.
Figure 5:
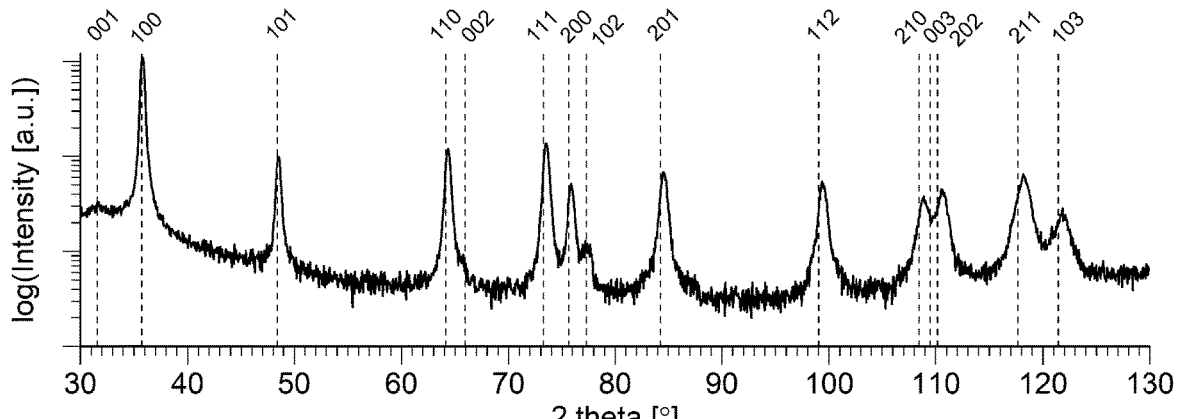

Embodiments of the present invention will be disclosed in more detail in connection with the following examples. The examples are to be considered as illustrative and not limiting embodiments. In the following examples coated cutting tools (inserts) were manufactured, analyzed and evaluated in cutting tests.

Substrates

Cemented carbide substrates with an alternative binder, herein called NiFeCo-binder, were manufactured with a binder comprising about 80.7 wt % Ni, 13.7 wt % Fe and 5.6 wt % Co. The binder content in the cemented carbide was about 7 wt %. The cemented carbide substrates with the alternative binder were manufactured from a powder mixture with a composition of about 6.09 wt % Ni, 1.02 wt % Fe, 0.039 wt % Co, 1.80 wt % Ti, 2.69 wt % Ta, 0.41 wt % Nb, 0.09 wt % N and balance WC. The powder mixture was milled, dried, pressed and sintered at 1450° C. The sintered cemented carbide substrates comprised a binder enriched surface zone from the substrate surface and to a depth of about 30 μm into the body being essentially free from cubic carbides as measured in a light optical microscope. The amount carbon in the powder was about 6.07 wt %, while the amount carbon as measured in chemical analysis of the sintered cemented carbide was about 5.87 wt %. The sintered cemented carbide comprised about 0.4 wt % Co, 1.0 wt % Fe and 5.9 wt % Ni. The Co originated mainly from the milling bodies that were worn during the milling step. No free graphite or eta phase was visible in a SEM micrograph of a cross section of the cemented carbide substrates.

As a reference, cemented carbide substrates with Co in the metallic binder, herein called Co-binder, were manufactured from a powder mixture with a composition of about 7.20 wt % Co, 1.80 wt % Ti, 2.69 wt % Ta, 0.41 wt % Nb, 0.09 wt % N and balance WC. The powder mixture was milled, dried, pressed and sintered at 1450° C. The sintered cemented carbide substrates comprised a Co enriched surface zone from the substrate surface and to a depth of about 23 μm into the body being essentially free from cubic carbides as measured in a light optical microscope. The sintered cemented carbide substrates comprised about 7.2 wt % Co. No free graphite or eta phase was visible in a SEM micrograph of a cross section of the cemented carbide substrates. These substrates are included here as a reference with no problems associated with Ni diffusion.

The geometry of the cemented carbide substrates were of ISO-type CNMG120408 for turning.

Coating Deposition

CVD coatings were deposited on the two cemented carbide compositions. Prior to the coating deposition every substrate was cleaned in a gentle blasting step to remove the outermost metal from the surfaces. The substrates were cleaned in ethanol bath for 30 minutes shortly before the depositions.

The $W(C_xN_{1-x})_y$ layers were deposited in a hot-wall horizontal tube furnace reactor described in detail in J. Gerdin Hulkko, Muspel and Surtr: *CVD system and control program for WF$_6$ chemistry*, Licentiate thesis, Monograph, Uppsala University, 2019. The main characteristics of the reactor system are described here. The tube is made of a ferritic iron-chromium-aluminum alloy from Kanthal. An inner tube made of isotropic graphite prevents the outer tube from extensive etching and it has an inner diameter of 47 mm. The tube has a 175 mm long cold zone before reaching the furnace. The furnace has a 130 mm unheated zone followed by three separately heated zones of 250 mm, 500 mm, 250 mm and a last unheated zone of 130 mm. The temperature in the heated zones is controlled by Eurotherm 3216 PID controllers and K-type thermocouples are placed outside the reactor tube and inside the furnace at the center of each zone. The inside temperature in the central zone was calibrated with a K-type thermocouple inserted through a 3 mm O-ring sealed port. During the processes the three heated zones were kept at the same temperature.

The precursor flows are controlled by MKS GM50A mass flow controllers for the $WF_6$ (5.5 purity), $H_2$ (5.6 purity) and Ar (6.0 purity) and by a MKS 1152C mass flow controller kept at a temperature of 40° C. for the $CH_3CN$ (>99.9% purity). The $CH_3CN$ evaporator cylinder is kept at 25° C. and the pipes between the cylinder and mass flow controller at 45° C. All other gases are kept in cylinders at room temperature. The gases are transported in 316 stainless steel pipes and at the connections silver plated VCR or copper gaskets are used. The bulk gas ($H_2$ diluted with Ar) enter the reactor tube directly at the front of the reactor. The other two precursors ($WF_6$ with Ar and $CH_3CN$ with Ar) are transported in separate Inconel600 pipes through the first heated zone and enter the reactor tube 25 mm into the central heated zone. The low pressure is maintained by a S20N root pump from Ebara technologies (maximum capacity 100 $m_3$/h, ultimate pressure $3.75 \times 10^{-2}$ Torr). The gas flow is throttled by an O-ring sealed butterfly valve (MKS 153D) and regulated by a PID vacuum control system (MKS 946). For the pressure measurement a 1 Torr full-range temperature stabilized capacitance manometer (MKS 627B) is used. The pressure readout was calibrated by pumping the system to the high vacuum range by a turbomolecular pump.

The deposition zone was between 90-230 mm from the gas mixing point, where coatings of even thickness, the same crystallographic phase and the same dominating texture could be obtained.

$W(C_xN_{1-x})_y$ was deposited using 1.8 vol % $WF_6$, 1.2 vol % $CH_3CN$, 25 vol % $H_2$ and balance Ar at 715° C. and at a pressure of 133 Pa. The total gas flow was set to 350 sccm and the deposition rate was about 0.5 μm per hour.

Thereafter the samples C, D, E1, E2, F and G were moved for deposition of additional layers in a radial Ionbond Bernex TM type CVD equipment 530 size capable of housing 10000 half-inch size cutting inserts.

The substrates were first coated with a TiN-layer using $TiCl_4$, $N_2$ and $H_2$ at 885° C. The TiN deposition time was adapted to reach a total TiN layer thickness of 0.4 μm.

Thereafter an approximately 8 μm TiCN layer was deposited by employing the well-known MTCVD technique using $TiCl_4$, $CH_3CN$, $N_2$, HCl and $H_2$ at 885° C. The volume ratio of $TiCl_4/CH_3CN$ in an initial part of the MTCVD deposition of the TiCN layer was 6.6, followed by a period using a ratio of $TiCl_4/CH_3CN$ of 3.7. The details of the TiN and the TiCN deposition are shown in Table 1.

TABLE 1

| MTCVD of TiN and TiCN | | | | | | |
|---|---|---|---|---|---|---|
| MT CVD of TiN and TiCN (885° C.): | Pressure [mbar] | $H_2$ [vol %] | $N_2$ [vol %] | HCl [vol %] | $TiCl_4$ [vol %] | $CH_3CN$ [vol %] |
| TiN | 400 | 48.8 | 48.8 | — | 2.44 | — |
| TiCN inner | 55 | 59.0 | 37.6 | — | 2.95 | 0.45 |
| TiCN outer | 55 | 81.5 | 7.8 | 7.8 | 2.38 | 0.65 |

After the deposition of the TiCN outer layer the temperature was increased from 885° C. to 1000° C. in an atmosphere of 75 vol % $H_2$ and 25 vol % $N_2$.

A 0.7-2 μm thick bonding layer was deposited at 1000° C. on top of the MTCVD TiCN layer by a process consisting of four separate reaction steps. First a HTCVD TiCN step using $TiCl_4$, $CH_4$, $N_2$, HCl and $H_2$ at 400 mbar, then a second step (TiCNO-1) using $TiCl_4$, $CH_3CN$, CO, $N_2$ and $H_2$ at 70 mbar, then a third step (TiCNO-2) using $TiCl_4$, $CH_3CN$, CO, $N_2$ and $H_2$ at 70 mbar and finally a fourth step (TiN-3) using $TiCl_4$, $N_2$ and $H_2$ at 70 mbar. During the third deposition step the CO gas flow was continuously linearly increased from a start value to a stop value as shown in Table 2. All other gas flows were kept constant, but since the overall gas flow is increased. The concentration of all gases are somewhat influenced due to this. Prior to the start of the subsequent $Al_2O_3$ nucleation, the bonding layer was oxidized for 4 minutes in a mixture of $CO_2$, CO, $N_2$ and $H_2$.

The details of the bonding layer deposition are shown in Table 2.

TABLE 2

| Bonding layer deposition | | | | | | | | | |
|---|---|---|---|---|---|---|---|---|---|
| Bonding layer | Pressure [mbar] | $H_2$ [vol %] | $N_2$ [vol %] | $CH_4$ [vol %] | HCl [vol %] | CO [vol %] | $TiCl_4$ [vol %] | $CH_3CN$ [vol %] | $CO_2$ [vol %] |
| Temp. increase | | 75 | 25 | | | | | | |
| HTCVD TiCN | 400 | 67.9 | 25.5 | 3.4 | 1.7 | — | 1.55 | — | — |
| TiCNO-1 | 70 | 83.7 | 12.0 | — | 1.2 | 1.2 | 1.5 | 0.40 | — |
| TiCNO-2 | 70 | 63.1-61.1 | 31.5-30.6 | — | — | 1.6-4.6 | 3.15-3.06 | 0.65-0.63 | — |
| TiN-3 | 70 | 64.5 | 32.3 | — | — | — | 3.23 | — | — |
| Oxidation | 55 | 53.8 | 30 | — | — | 12.5 | — | — | 3.7 |

On top of the bonding layer an α-$Al_2O_3$ layer was deposited. All the α-$Al_2O_3$ layers were deposited at 1000° C. and 55 mbar in two steps. The first step using 1.2 vol-% $AlCl_3$, 4.7 vol-% $CO_2$, 1.8 vol-% HCl and balance $H_2$ giving about 0.1 μm α-$Al_2O_3$ and a second step as disclosed below giving a total α-$Al_2O_3$ layer thickness of about 5 μm. The second step of the α-$Al_2O_3$ layer was deposited using 1.16% $AlCl_3$, 4.65% $CO_2$, 2.91% HCl, 0.58% $H_2S$ and balance $H_2$.

The samples F and G were also provided with an outermost wear indication layer of TiN.

A summary of the samples is given in Table 3.

TABLE 3

Summary of samples

| Sample | Metallic binder | $W(C_xN_{1-x})_y$ [μm] | TiN [μm] | TiCN [μm] | Bonding layer [μm] | $\alpha\text{-}Al_2O_3$ [μm] | TiN [μm] |
|---|---|---|---|---|---|---|---|
| A Reference | Co | — | 0.29 | 8.22 | 0.76 | 5.29 | — |
| B Reference | NiFeCo | — | 0.29 | 8.22 | 0.76 | 5.29 | — |
| B2 Reference | NiFeCo | — | 0.42 | 8.44 | 0.91 | 5.95 | |
| C Reference | NiFeCo | 0.25 | 0.39 | 8.1 | 0.78 | 5.88 | — |
| D Invention | NiFeCo | 0.64 | 0.29 | 8.33 | 0.83 | 5.04 | — |
| E1 Invention | NiFeCo | 1.02 | 0.29 | 8.15 | 0.83 | 5.08 | — |
| E2 Invention | NiFeCo | 1.28 | 0.45 | 8.99 | 0.84 | 5.39 | |
| F Invention | NiFeCo | 2.14 | 0.33 | 8.73 | 0.85 | 5.17 | 0.63 |
| G Invention | NiFeCo | 6.03 | 0.31 | 8.58 | 0.80 | 5.27 | 0.92 |

Coating Analysis

The compositions of the $W(C_xN_{1-x})_y$ layers were determined on a reference sample by ERDA to be 43.7 at % W, 39.2 at % C and 17.1 at % N which corresponds to a $W(C_{0.7}N_{0.3})_{1.3}$ chemical formula.

Grazing incidence X-ray diffraction was used to analyse the phase of the $W(C_xN_{1-x})_y$ layer. The diffractogram shows that only the hexagonal phase was present in the coating, no cubic $WC_{1-x}$ or $WN_y$ ($0.5 \leq y \leq 2$) reflections and no reflections of the tungsten-rich $W_2C$ phases (with a hexagonal closed packed W-sublattice and C-atoms in half of the octahedral holes) were identified. The reference reflexes are calculated from Z. Anorg. Allg. Chem., 1926, vol 156, pp 27-36.

The $W(C_xN_{1-x})_y$ layers were studied in SEM and it was noticed that the $W(C_xN_{1-x})_y$ grains were columnar. No eta-phase was found at the interface between the substrate and the the the $W(C_xN_{1-x})_y$ layers or within the $W(C_xN_{1-x})_y$ layers. Eta-phase was found at the interface to the substrate and within the TiN and the TiCN layers for the reference samples B1 and B2.

The average grain width and the orientation of the $W(C_xN_{1-x})_y$ layer were analyzed with EBSD and the results are presented in table 4.

TABLE 4

$W(C_xN_{1-x})_y$ layer details

| Sample | EBSD orientation of the W(CxN1 x)y layer, within 30° from <11-20> | Analyzed area [μm] × [μm] | Number of analyzed grains | EBSD Grain width [μm] |
|---|---|---|---|---|
| C | 62.9% | 220 × 7.35 | 732 | 0.13 |
| D | 81.8% | 120 × 4.75 | 1004 | 0.18 |
| E1 | 81.5% | 120 × 7.45 | 1760 | 0.16 |
| F | 84.7% | 110 × 29.5 | 1383 | 0.23 |
| G | 94.5% | 110 × 30.45 | 1882 | 0.27 |

Due to the symmetry of the hexagonal δ-WC phase the results can be interpreted as the following: In a ±30° angle range all the possible crystallographic directions perpendicular to the <0001> direction are included. The selected interval also means that the <0001 >direction in the grains deviates by a maximum angle of 30° from the substrate surface plane. The texture of the coatings can thus be described as hexagonal prisms with their <0001>-direction lying preferentially parallel to the substrate surface or slightly tilted from that.

The texture coefficient TC(hkl) of the TiCN layer and the $\alpha\text{-}Al_2O_3$ layer were analyzed as disclosed above with X-ray diffraction using Cu Kα radiation and θ-2θ scan. The TC(0 0 12) and the TC(4 2 2) are presented in table 5.

TABLE 5

Texture coefficients of outer layers

| Sample | TC(4 2 2) of TiCN layer | TC(0 0 12) of $\alpha\text{-}Al_2O_3$ layer |
|---|---|---|
| A | 4.06 | 7.62 |
| B1 | 2.19 | 5.62 |
| B2 | 1.92 | 4.81 |
| C | 1.90 | 4.66 |
| D | 4.85 | 7.71 |
| E1 | 4.96 | 7.74 |
| E2 | 4.98 | 7.70 |
| F | 5.45 | 7.78 |
| G | 5.79 | 7.82 |

It can be concluded from the X-ray diffraction analysis and the texture coefficient that the reference sample C provided with an about 250 nm $W(C_xN_{1-x})_y$ layer shows lower TC(4 2 2) and lower TC(0 0 12) as compared to the inventive sample D provided with an about 640 nm $W(C_xN_{1-x})_y$ layer.

Cutting Tests

The coated cutting tools of the ISO type CNMG120408 were tested in longitudinal turning in ball bearing steel (100CrMo7-3) using the following cutting data;

Cutting speed $v_c$: 220 m/min
Cutting feed, f: 0.3 mm/revolution
Depth of cut, $a_p$: 2 mm
Water miscible metal working fluid was used.
One cutting edge per cutting tool was evaluated.

In analyzing the crater wear, the area of exposed substrate was measured, using a light optical microscope. When the surface area of the exposed substrate exceeded 0.2 mm² the lifetime of the tool was considered to be reached. The wear of each cutting tool was evaluated after 2 minutes cutting in the light optical microscope. The cutting process was then continued with a measurement after each 2 minutes run, until the tool life criterion was reached. When the size of the crater area exceeded 0.2 mm² the time until the tool life criterion was met was estimated based on an assumed constant wear rate between the two last measurements. Beside crater wear, flank wear was also monitored. Three parallel tests were run for each type of coating. The results presented as an average tool life are shown in Table 6.

TABLE 6

| | | Cutting test results | |
|---|---|---|---|
| Sample | W($C_xN_{1-x}$)$_y$ layer thickness [μm] | Metallic binder in substrate cemented carbide | Tool life [minutes] |
| E2 | 1.02 | NiFeCo | 45 |
| B2 | No | NiFeCo | 23 |
| A | No | Co | 55 |

It can be concluded that the E2 sample provided with a W($C_xN_{1-x}$)$_y$ layer according to the invention outperforms the reference sample B2. As expected the reference sample A, with no disturbing Ni in the metallic binder phase of the cemented carbide, is also performing well.

While the invention has been described in connection with various exemplary embodiments, it is to be understood that the invention is not to be limited to the disclosed exemplary embodiments; on the contrary, it is intended to cover various modifications and equivalent arrangements within the appended claims.

The invention claimed is:

1. A coated cutting tool comprising a substrate at least partially coated with a coating, said substrate being made of cemented carbide composed of hard constituents in a metallic binder and wherein said metallic binder comprises more than 60 wt % Ni, said coating including two or more layers, wherein a layer adjacent to the substrate is a W($C_xN_{1-x}$)$_y$ layer, wherein $0.6 \leq x \leq 0.8$ and $1.1 \leq y \leq 1.8$ with a W($C_xN_{1-x}$)$_y$ layer thickness of 0.4-7 μm.

2. The coated cutting tool according to claim 1, wherein the W($C_xN_{1-x}$)$_y$ layer is of hexagonal phase.

3. The coated cutting tool of claim 1, wherein the W($C_xN_{1-x}$)$_y$ layer is composed of grains that are columnar.

4. The coated cutting tool of claim 1, wherein an average grain width of the W($C_xN_{1-x}$)$_y$ layer is 0.14-0.40 μm.

5. The coated cutting tool of claim 1, wherein the W($C_xN_{1-x}$)$_y$ layer exhibits an orientation as measured with EBSD on a cross section of said W($C_xN_{1-x}$)$_y$ layer and an analyzed area of 100 μm in width and a full W($C_xN_{1-x}$)$_y$ layer thickness in height, wherein a surface normal of the W($C_xN_{1-x}$)$_y$ layer is parallel to a growth direction of said layer, wherein $\geq 75\%$ of the analyzed area has a <11-20> direction within 30 degrees from the surface normal of the W($C_xN_{1-x}$)$_y$ layer.

6. The coated cutting tool of claim 1, wherein the metallic binder comprises 65-90 wt % Ni.

7. The coated cutting tool of claim 1, wherein the metallic binder content in the cemented carbide is 3-20 wt %.

8. The coated cutting tool of claim 1, wherein the coating includes a TiCN layer, wherein a thickness of the TiCN layer is 6-12 μm.

9. The coated cutting tool of claim 8, wherein the TiCN layer exhibits a texture coefficient TC(hkl), as measured by X-ray diffraction using Cu Kα radiation and θ-2θ scan, defined according to Harris formula $$TC(hkl) = \frac{I(hkl)}{I_0(hkl)} \left[ \frac{1}{n} \sum_{n=1}^{n} \frac{I(hkl)}{I_0(hkl)} \right]^{-1}$$

where I(hkl) is the measured intensity (integrated area) of the (hkl) reflection, $I_0$(hkl) is the standard intensity according to ICDD's PDF-card No 42-1489, n is the number of reflections, reflections used in the calculation are (1 1 1), (2 0 0), (2 20), (3 1 1), (3 3 1), (4 2 0), (4 2 2) and (5 1 1), wherein TC(4 2 2) is $\geq 3.5$.

10. The coated cutting tool of claim 1, wherein a total thickness of the coating is 2-25 μm.

11. The coated cutting tool of claim 1, wherein the coating further includes a layer of $Al_2O_3$, preferably located between an outermost surface of the cutting tool and a W($C_xN_{1-x}$)$_y$ layer.

12. The coated cutting tool of claim 11, wherein the $Al_2O_3$ layer is an α-$Al_2O_3$ layer.

13. The coated cutting tool of claim 12, wherein said α-$Al_2O_3$ layer exhibits a texture coefficient TC(hkl), as measured by X-ray diffraction using Cu Kα radiation and θ-2θ scan, defined according to Harris formula, where I(hkl) is the measured intensity (integrated area) of the (hkl) reflection, $I_0$(hkl) is the standard intensity according to ICDD's PDF-card No. 00-010-0173, n is the number of reflections used in the calculation, and where the (hkl) reflections used are (1 0 4), (1 1 0), (1 1 3), (0 2 4), (1 1 6), (2 1 4), (3 0 0) and (0 0 12), wherein TC(0 0 12)$\geq 5$.

14. The coated cutting tool of claim 11, wherein a thickness of the $Al_2O_3$ layer is 4-8 μm.

15. The coated cutting tool of claim 1, wherein the coating is a CVD coating.

* * * * *